US012796070B2

(12) United States Patent
Wang et al.

(10) Patent No.: US 12,796,070 B2
(45) Date of Patent: Nov. 10, 2026

(54) ALL-LATERAL WIDE BAND-GAP CASCODE SWITCH DEVICE

(71) Applicant: Taiwan-Asia Semiconductor Corporation, Hsinchu City (TW)

(72) Inventors: Di-Bao Wang, Hsinchu City (TW); Jui-Lun Chung, Hsinchu City (TW)

(73) Assignee: Taiwan-Asia Semiconductor Corporation, Hsinchu City (TW)

( * ) Notice: Subject to any disclaimer, the term of this patent is extended or adjusted under 35 U.S.C. 154(b) by 295 days.

(21) Appl. No.: 18/779,820

(22) Filed: Jul. 22, 2024

(65) Prior Publication Data

US 2025/0204033 A1 Jun. 19, 2025

(30) Foreign Application Priority Data

Dec. 14, 2023 (TW) ................................ 112148671

(51) Int. Cl.
*H10D 84/84* (2025.01)
*H03K 17/687* (2006.01)
(Continued)

(52) U.S. Cl.
CPC ........... *H10D 84/84* (2025.01); *H03K 17/687* (2013.01); *H10D 30/475* (2025.01);
(Continued)

(58) Field of Classification Search
CPC ............. H10D 30/475; H10D 62/8325; H10D 62/8503; H10D 64/411; H10D 84/84; H10D 84/811; H10D 62/85–854; H03K 17/687; H03K 2017/6875; H03K 17/102; H10W 72/884; H10W 72/926; H10W 90/00;
(Continued)

(56) References Cited

U.S. PATENT DOCUMENTS

| | | | |
|---|---|---|---|
| 10,566,270 B2 | 2/2020 | Xu et al. |
| 2014/0175454 A1 | 6/2014 | Roberts et al. |

(Continued)

FOREIGN PATENT DOCUMENTS

| | | |
|---|---|---|
| CN | 207705191 U | 8/2018 |
| CN | 113764368 A | 12/2021 |

(Continued)

*Primary Examiner* — Shahed Ahmed
(74) *Attorney, Agent, or Firm* — MUNCY, GEISSLER, OLDS & LOWE, P.C.

(57) ABSTRACT

An all-lateral wide band-gap (WBG) cascode switch device is provided, which includes a source terminal; a gate terminal; a drain terminal; a lateral enhancement-mode silicon semiconductor switch, having a first source electrode, a first drain electrode, and a first gate electrode; and a lateral depletion-mode WBG semiconductor switch disposed laterally apart from and cascoded with the lateral enhancement-mode silicon semiconductor switch, having a second source electrode, a second drain electrode, and a second gate electrode. The first source electrode, the first drain electrode, and the first gate electrode of the lateral enhancement-mode silicon semiconductor switch and the second source electrode, the second drain electrode and the second gate electrode of the lateral depletion-mode WBG semiconductor switch have the same vertical orientation to face the same side.

12 Claims, 9 Drawing Sheets

(51) Int. Cl.

| | |
|---|---|
| ***H10D 30/47*** | (2025.01) |
| ***H10D 62/832*** | (2025.01) |
| ***H10D 62/85*** | (2025.01) |
| ***H10D 64/27*** | (2025.01) |
| ***H10D 84/80*** | (2025.01) |

(52) U.S. Cl.
CPC ..... *H10D 62/8325* (2025.01); *H10D 62/8503* (2025.01); *H10D 64/411* (2025.01); *H10D 84/811* (2025.01); *H03K 2017/6875* (2013.01)

(58) Field of Classification Search
CPC .......... H10W 72/551; H10W 72/50–59; H10P 14/2904; H10P 14/3414–3422
See application file for complete search history.

(56) References Cited

U.S. PATENT DOCUMENTS

| | | | | |
|---|---|---|---|---|
| 2014/0225162 | A1* | 8/2014 | Briere | H03K 17/107 257/195 |
| 2019/0020272 | A1 | 1/2019 | Disney et al. | |
| 2020/0365565 | A1* | 11/2020 | Yandoc | H03K 17/102 |
| 2021/0391311 | A1 | 12/2021 | Rhodes et al. | |
| 2022/0037515 | A1* | 2/2022 | Zhang | H10D 30/015 |
| 2025/0120173 | A1* | 4/2025 | Chen | H03K 17/08122 |

FOREIGN PATENT DOCUMENTS

| | | |
|---|---|---|
| CN | 114582862 A | 6/2022 |
| JP | 2017-123358 | 7/2017 |

* cited by examiner

ALL-LATERAL WIDE BAND-GAP CASCODE SWITCH DEVICE

CROSS-REFERENCES TO RELATED APPLICATIONS

This application claims priority to Taiwan Patent Application No. 112148671 filed on Dec. 14, 2023, which is hereby incorporated by reference in its entirety.

BACKGROUND OF THE INVENTION

Field of the Invention

The present invention relates to an all-lateral wide band-gap (WBG) cascode switch device, particularly a switching device using a lateral depletion-mode WBG semiconductor switch and a lateral enhancement-mode silicon semiconductor switch with the same vertical orientation.

Description of the Related Art

In recent years, gallium nitride (GaN) cascode switching devices have been widely used in the fields of consumer electronics, automation and control systems, communication systems, and electric vehicles.

The GaN cascode switching devices are suitable for power switching systems with voltages between 600 and 900 volts (V) and currents between 20 and 60 amps (A). However, the switching frequency and the reliability of the GaN cascode switching devices are limited by the component and packaging architectures. Therefore, it is difficult to significantly improve them.

Given this, how to improve the switching frequency and the reliability of GaN cascode switching devices to meet various application requirements is an urgent issue for the industry to solve.

SUMMARY OF THE INVENTION

An objective of the present invention is to provide an all-lateral WBG cascode switch device whose switching frequency and reliability are improved by using a lateral depletion-mode WBG semiconductor switch and a lateral enhancement-mode silicon semiconductor switch with the same vertical orientation. Therefore, compared with the conventional GaN cascode switching device, the all-lateral WBG cascode switch device of the present invention has higher switching frequency and higher reliability, and has more flexibility and versatility in the assembly and packaging architectures to meet the various application requirements.

To achieve the above objective, the present invention discloses an all-lateral WBG cascode switch device including: a source terminal; a gate terminal; a drain terminal; a lateral enhancement-mode silicon semiconductor switch having a first source electrode, a first drain electrode, and a first gate electrode; and a lateral depletion-mode WBG semiconductor switch disposed laterally apart from and cascoded with the lateral enhancement-mode silicon semiconductor switch, having a second source electrode, a second drain electrode, and a second gate electrode. The first source electrode is coupled to the source terminal. The first gate electrode is coupled to the gate terminal. The first drain electrode is coupled to the second source electrode. The second gate electrode is coupled to the first source electrode. The second drain electrode is coupled to the drain terminal. The first source electrode, the first drain electrode, and the first gate electrode of the lateral enhancement-mode silicon semiconductor switch and the second source electrode, the second drain electrode and the second gate electrode of the lateral depletion-mode WBG semiconductor switch have the same vertical orientation to face the same side.

In an example, the lateral depletion-mode WBG semiconductor switch is one of a depletion-mode gallium nitride (GaN) high electron mobility transistor (HEMT) and a silicon carbide (SiC) junction field-effect transistor (JFET).

In an example, the lateral enhancement-mode silicon semiconductor switch is an enhancement-mode metal oxide semiconductor field-effect transistor (MOSFET).

In an example, the first source electrode, the first drain electrode and the first gate electrode of the lateral enhancement-mode silicon semiconductor switch and the second source electrode, the second drain electrode and the second gate electrode of the lateral depletion-mode WBG semiconductor switch are vertically oriented upward.

In an example, the source terminal, the gate terminal, the drain terminal, the first source electrode, the first drain electrode and the first gate electrode of the lateral enhancement-mode silicon semiconductor switch, and the second source electrode, the second drain electrode and the second gate electrode of the lateral depletion-mode WBG semiconductor switch are coupled by wire bonding.

In an example, the source terminal, the gate terminal, the drain terminal, the first source electrode, the first drain electrode and the first gate electrode of the lateral enhancement-mode silicon semiconductor switch, and the second source electrode, the second drain electrode and the second gate electrode of the lateral depletion-mode WBG semiconductor switch are coupled by copper clips.

In an example, the first source electrode, the first drain electrode and the first gate electrode of the lateral enhancement-mode silicon semiconductor switch and the second source electrode, the second drain electrode and the second gate electrode of the lateral depletion-mode WBG semiconductor switch are vertically oriented downward.

In an example, the source terminal, the gate terminal, the drain terminal, the first source electrode, the first drain electrode and the first gate electrode of the lateral enhancement-mode silicon semiconductor switch, and the second source electrode, the second drain electrode and the second gate electrode of the lateral depletion-mode WBG semiconductor switch are coupled in a flip-chip manner through a plurality of metal interconnections in a carrier substrate.

In an example, a bottom of a substrate of the lateral enhancement-mode silicon semiconductor switch and a bottom of a substrate of the lateral depletion-mode WBG semiconductor switch have a plurality of trenches.

In an example, the all-lateral WBG cascode switch device further includes: a first passive component coupled between the first gate electrode and the gate terminal; and a second passive component coupled between a first contact and a second contact, the first contact being between the first drain electrode and the second source electrode, the second contact being between the second gate electrode and the first source electrode.

In an example, the second passive component is one of a resistor and a Zener diode.

In an example, the all-lateral WBG cascode switch device is packaged into a power switching device by a molding material.

After referring to the drawings and the detailed description of embodiments described later, those of ordinary skill in the art can understand other objectives of the present invention, as well as the technical means and implementations of the present invention.

DETAILED DESCRIPTION OF THE PREFERRED EMBODIMENT

In the following description, the present invention will be explained with reference to various embodiments thereof. These embodiments of the present invention are not intended to limit the present invention to any specific environment, application or particular method for implementations described in these embodiments. Therefore, the description of these embodiments is for illustrative purposes only and is not intended to limit the present invention. It shall be appreciated that, in the following embodiments and the attached drawings, partial elements not directly related to the present invention are omitted from the illustration, and dimensional proportions among individual elements and the numbers of each element in the accompanying drawings are provided only for ease of understanding but are not intended to limit the actual scale.

Figure 1:
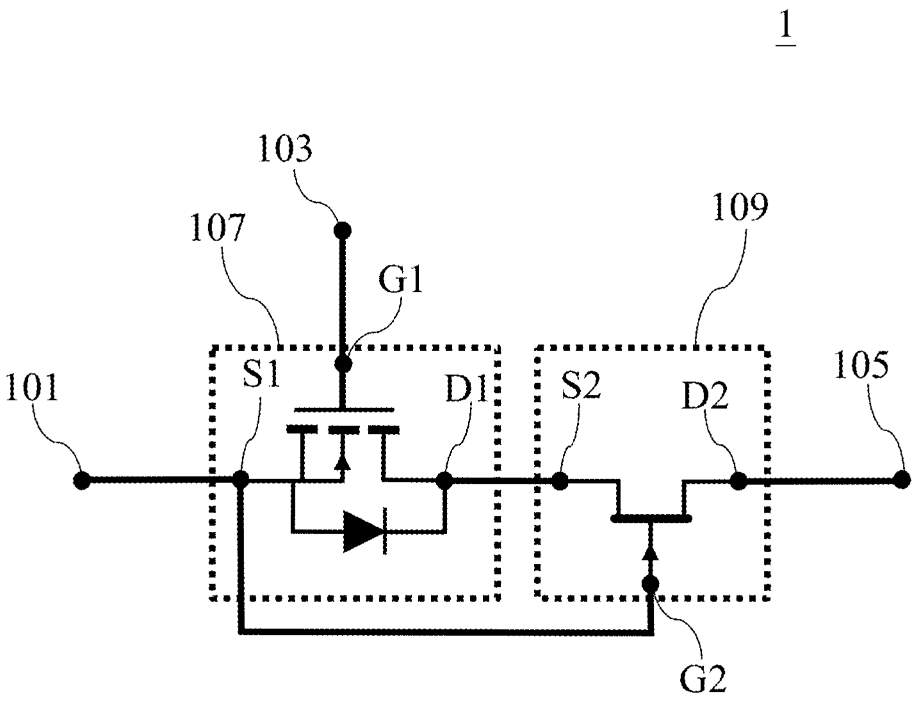
FIG. 1 is a circuit schematic view of an all-lateral WBG cascode switch device according to an embodiment of the present invention.

An embodiment of the present invention is shown in FIG. 1, which is an all-lateral WBG cascode switch device 1. The all-lateral WBG cascode switch device 1 includes a source terminal 101, a gate terminal 103, a drain terminal 105, a lateral enhancement-mode silicon semiconductor switch 107 and a lateral depletion-mode WBG semiconductor switch 109.

The lateral enhancement-mode silicon semiconductor switch 107 has a first source electrode S1, a first drain electrode D1 and a first gate electrode G1. The lateral enhancement-mode silicon semiconductor switch 107 may be an enhancement-mode metal oxide semiconductor field-effect transistor (MOSFET).

The lateral depletion-mode WBG semiconductor switch 109 is disposed laterally apart from and cascoded with the lateral enhancement-mode silicon semiconductor switch 107. The lateral depletion-mode WBG semiconductor switch 109 has a second source electrode S2, a second drain electrode D2 and a second gate electrode G2. The lateral depletion-mode WBG semiconductor switch 109 may be one of a depletion-mode gallium nitride (GaN) high electron mobility transistor (HEMT) or a silicon carbide (SiC) junction field effect transistor (JFET).

The first source electrode S1 of the lateral enhancement-mode silicon semiconductor switch 107 is coupled to the source terminal 101. The first gate electrode G1 of the lateral enhancement-mode silicon semiconductor switch 107 is coupled to the gate terminal 103. The first drain electrode D1 of the lateral enhancement-mode silicon semiconductor switch 107 is coupled to the second source electrode S2 of the lateral depletion-mode WBG semiconductor switch 109. The second gate electrode G2 of the lateral depletion-mode WBG semiconductor switch 109 is coupled to the first source electrode S1 of the lateral enhancement-mode silicon semiconductor switch 107. The second drain electrode D2 of the lateral depletion-mode WBG semiconductor switch 109 is coupled to the drain terminal 105. Accordingly, the all-lateral WBG cascode switch device 1 of the present invention can be constructed by coupling the components as mentioned above.

The first source electrode S1, the first drain electrode D1 and the first gate electrode G1 of the lateral enhancement-mode silicon semiconductor switch 107 and the second source electrode S2, the second drain electrode D2 and the second gate electrode G2 of the lateral depletion-mode WBG semiconductor switch 109 have the same vertical orientation, that is, they face the same side in the all-lateral WBG cascode switch device 1. Different implementations of the same vertical orientation will be further described in the following embodiments.

Figure 2:
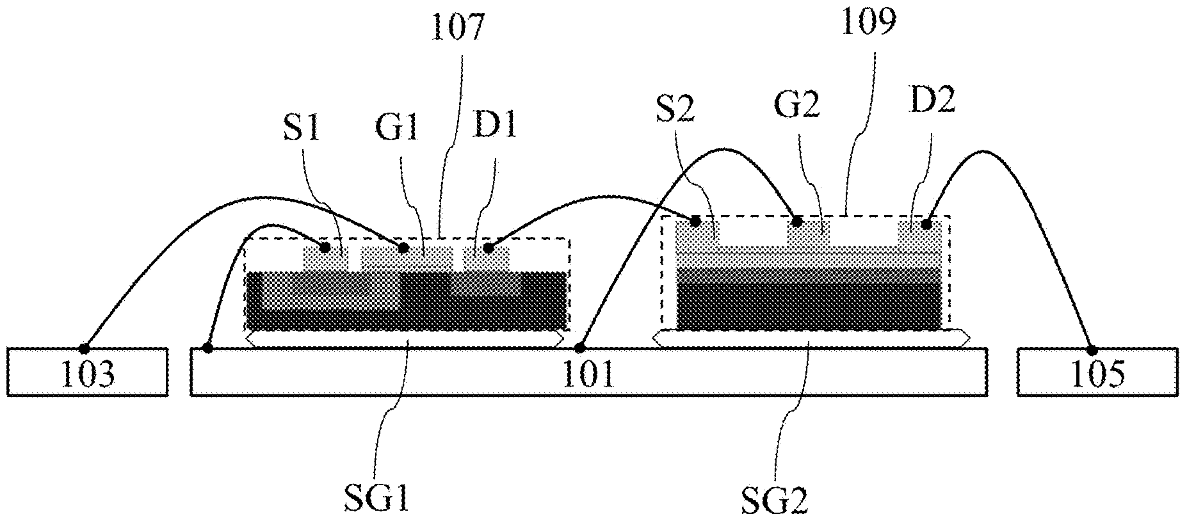
FIG. 2 is a structural schematic view of an all-lateral WBG cascode switch device according to an embodiment of the present invention.

FIG. 2 is a structural schematic view of an all-lateral WBG cascode switch device 1 according to an embodiment of the present invention. The first source electrode S1, the first drain electrode D1 and the first gate electrode G1 of the lateral enhancement-mode silicon semiconductor switch 107 and the second source electrode S2, the drain electrode D2 and the second gate electrode G2 of the lateral depletion-mode WBG semiconductor switch 109 are vertically oriented upward. In this example, as shown in FIG. 2, the source terminal 101, the gate terminal 103, the drain terminal 105, the first source electrode S1, the first drain electrode D1 and the first gate electrode G1 of the lateral enhancement-mode silicon semiconductor switch 107, and the second source electrode S2, the second drain electrode D2 and the second gate electrode G2 of the lateral depletion-mode WBG semiconductor switch 109 are coupled by wire bonding.

However, in other embodiments, the source terminal 101, the gate terminal 103, the drain terminal 105, the first source electrode S1, the first drain electrode D1 and the first gate electrode G1 of the lateral enhancement-mode silicon semiconductor switch 107, and the second source electrode S2, the second drain electrode D2 and the second gate electrode G2 of the lateral depletion-mode WBG semiconductor switch 109 may be coupled by copper clips. Compared to wire bonding, the coupling method using copper clips can significantly reduce the inductive effects between components. Since a person having ordinary skill in the art can easily understand the implementation of the coupling using copper clips, no further schematic views are provided here for illustration.

The substrate of the lateral enhancement-mode silicon semiconductor switch 107 is bonded to the source terminal 101 by, for example, the silver adhesive SG1, and the substrate of the lateral depletion-mode WBG semiconductor switch 109 is bonded to the source terminal 101 by, for example, the silver adhesive SG2. In this structure, the source terminal 101 is like a metal carrier substrate to carry the lateral enhancement-mode silicon semiconductor switch 107 and the lateral depletion-mode WBG semiconductor switch 109.

Accordingly, since the lateral enhancement-mode silicon semiconductor switch 107 and the lateral depletion-mode WBG semiconductor switch 109 are both lateral components, the number of bonding wires can be reduced and heat dissipation efficiency can be improved. In addition, the assembly and packaging architectures have more flexibility and versatility.

Figure 3:
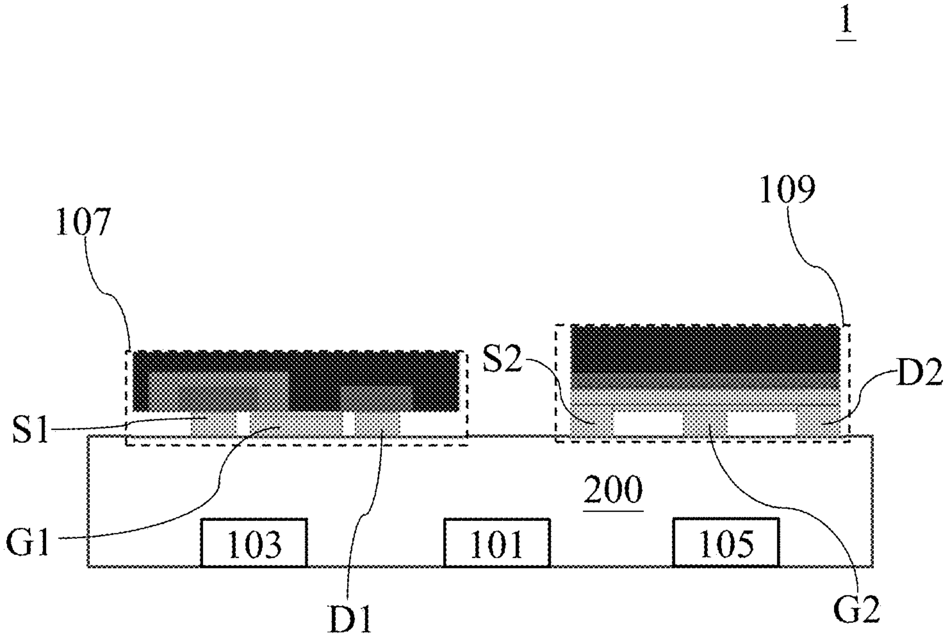
FIG. 3 is a structural schematic view of an all-lateral WBG cascode switch device according to an embodiment of the present invention.

FIG. 3 is a structural schematic view of an all-lateral WBG cascode switch device 1 according to an embodiment of the present invention. In this embodiment, the first source electrode S1, the first drain electrode D1 and the first gate electrode G1 of the lateral enhancement-mode silicon semiconductor switch 107 and the second source electrode S2, the drain electrode D2 and the second gate electrode G2 of the lateral depletion-mode WBG semiconductor switch 109 are vertically oriented downward, as shown in FIG. 3.

The source terminal 101, the gate terminal 103, the drain terminal 105, the first source electrode S1, the first drain electrode D1 and the first gate electrode G1 of the lateral enhancement-mode silicon semiconductor switch 107, and the second source electrode S2, the second drain electrode D2 and the second gate electrode G2 of the lateral depletion-mode WBG semiconductor switch 109 are coupled in a flip-chip manner through a plurality of metal interconnections in a carrier substrate 200. In other words, the first source electrode S1, the first drain electrode D1 and the first gate electrode G1 of the lateral enhancement-mode silicon semiconductor switch 107 and the second source electrode S2, the second drain electrode D2 and the second gate electrode G2 of the lateral depletion-mode WBG semiconductor switch 109 may be first coupled to corresponding contacts on the top surface of the carrier substrate 200, and then coupled to each other through the metal interconnections in the carrier substrate 200, or coupled to the source terminal 101, the gate terminal 103 and the drain terminal 105 formed on the bottom surface of the carrier substrate 200.

The carrier substrate 200 may be a chip substrate, e.g., a bismaleimide triazine (BT) substrate, an ajinomoto build-up film (ABF) substrate, a printed circuit board (PCB), an aluminum nitride (AlN) substrate, an aluminum oxide ($Al_2O_3$) substrate or a silicon substrate.

Figure 4:
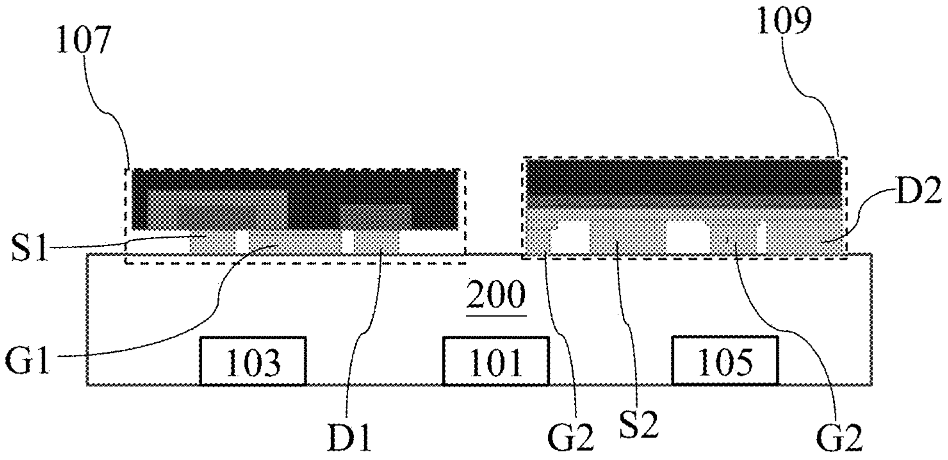
FIG. 4 is a structural schematic view of an all-lateral WBG cascode switch device according to an embodiment of the present invention.

FIG. 4 is a structural schematic view of an all-lateral WBG cascode switch device 1 according to an embodiment of the present invention. Different from the structure of the lateral depletion-mode WBG semiconductor switch 109 shown in FIG. 3, the structure of the lateral depletion-mode WBG semiconductor switch 109 shown in FIG. 4 extends with two second gate electrodes G2 (i.e., two metal layers electrically connected to each other, or two portions of a single metal layer). Thus, the wiring of such metal interconnections in the carrier substrate 200 can be simplified by utilizing the two second gate electrodes G2. As can be understood by a person having ordinary skill in the art, the wiring of these metal interconnections in the carrier substrate 200 can be made easier to design by adjusting the design of the number or position of the first source electrode S1, the first drain electrode D1 and the first gate electrode G1 of the lateral enhancement-mode silicon semiconductor switch 107, as well as the second source electrode S2, the second drain electrode D2 and the second gate electrode G2 of the lateral depletion-mode WBG semiconductor switch 109. Therefore, any designs of the number and position of the electrodes that achieve an equivalent effect as the present invention fall within the scope of the present invention.

Based on the above description, those skilled in the art can understand that the structures of the lateral enhancement-mode silicon semiconductor switch 107 and the lateral depletion-mode WBG semiconductor switch 109 can have various implementations. Furthermore, in the present invention, depending on different vertical orientations (upward or downward), suitable structures for the lateral enhancement-mode silicon semiconductor switch 107 and the lateral depletion-mode WBG semiconductor switch 109 can be chosen. Accordingly, the structures of the lateral enhancement-mode silicon semiconductor switch 107 and the structures of the lateral depletion-mode WBG semiconductor switch 109 shown in FIGS. 2 to 4 will not be further described here.

The electrical coupling between components through the carrier substrate 200 can avoid wiring or reduce the number of bonding wires and improve heat dissipation efficiency for thereby improving the overall component performance and reliability of the all-lateral WBG cascode switch device 1. Moreover, since the lateral enhancement-mode silicon semiconductor switch 107 and the lateral depletion-mode WBG semiconductor switch 109 are both lateral components, the assembly and packaging architectures have more flexibility and versatility.

Figure 5A:
FIGS. 5A and 5B depict different aspects of a plurality of trenches applicable to the bottom of the substrate of the lateral enhancement-mode silicon semiconductor switch and the bottom of the substrate of the lateral depletion-mode WBG semiconductor switch of the present invention.
Figure 5B:

In the vertically downward-oriented embodiment corresponding to FIG. 3 or FIG. 4, the bottom of the substrate of the lateral enhancement-mode silicon semiconductor switch 107 and the bottom of the substrate of the lateral depletion-mode WBG semiconductor switch 109 may have a plurality of trenches. The trenches may be formed by, for example, but are not limited to, dry etching to increase the heat dissipation surface area. The trenches may be zigzag (as shown in FIG. 5A) or rectangular (as shown in FIG. 5B), but the shape of the trenches of the present invention is not limited thereto. Various shapes or combinations of shapes that can achieve the purpose of increasing the heat dissipation surface area are applicable to the present invention.

Figure 7A:
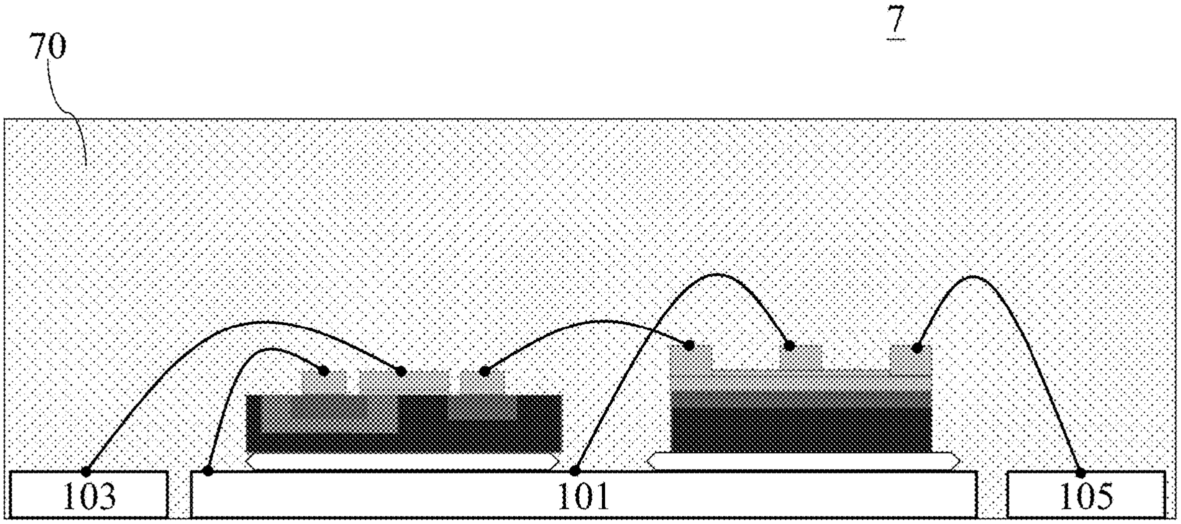
FIG. 7A is a schematic view depicting the all-lateral WBG cascode switch device shown in FIG. 2 being packaged into a power switching device by a molding material.
Figure 7B:
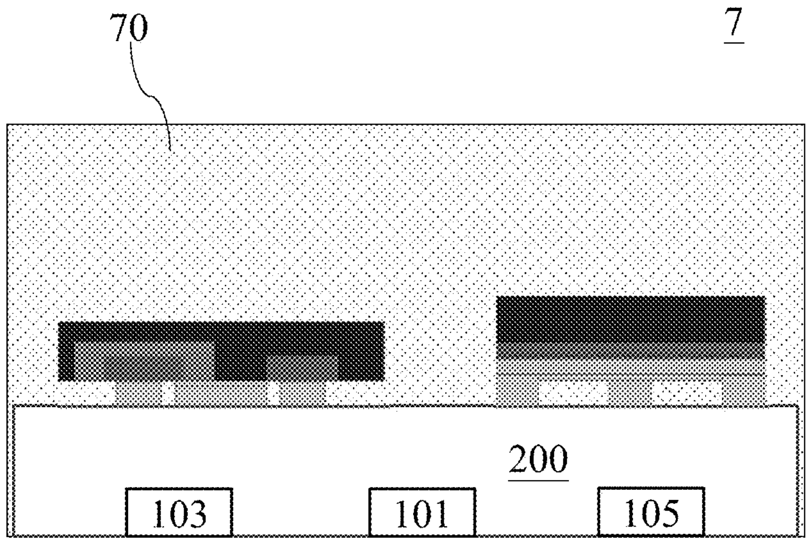
FIG. 7B is a schematic view depicting the all-lateral WBG cascode switch device shown in FIG. 3 being packaged into a power switching device by a molding material.
Figure 7C:
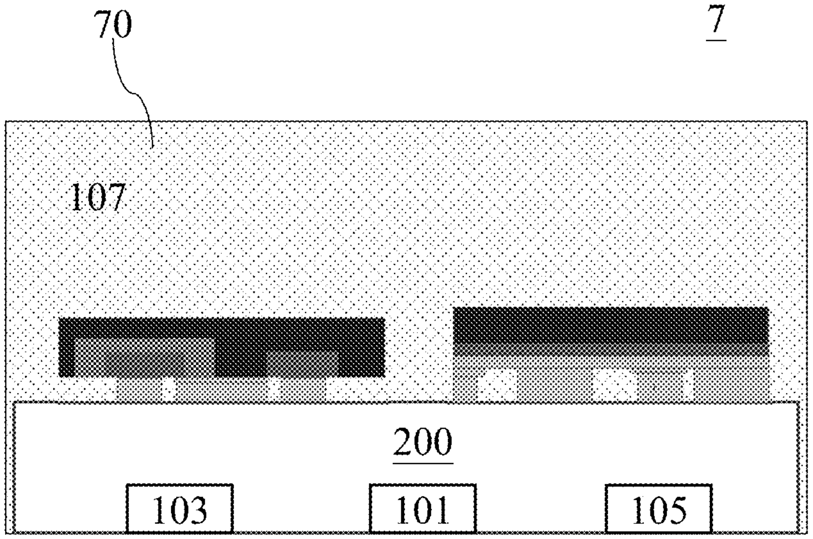
FIG. 7C is a schematic view depicting the all-lateral WBG cascode switch device shown in FIG. 4 being packaged into a power switching device by a molding material.

The structures of the all-lateral WBG cascode switch device 1 shown in FIGS. 2 to 4 may be further packaged using a molding material to form a power switching device for use in the fields of consumer electronics, automation and control systems, communication systems, electric vehicles, etc., to provide power switching functions by connecting it between other circuits. For example, FIG. 7A is a schematic view depicting the all-lateral WBG cascode switch device 1 shown in FIG. 2 being packaged into a power switching device 7 by a molding material 70. FIG. 7B is a schematic view depicting the all-lateral WBG cascode switch device 1 shown in FIG. 3 being packaged into a power switching device 7 by a molding material 70. In addition, FIG. 7C is a schematic view depicting the all-lateral WBG cascode switch device 1 shown in FIG. 4 being packaged into a power switching device 7 by a molding material 70.

Figure 6:
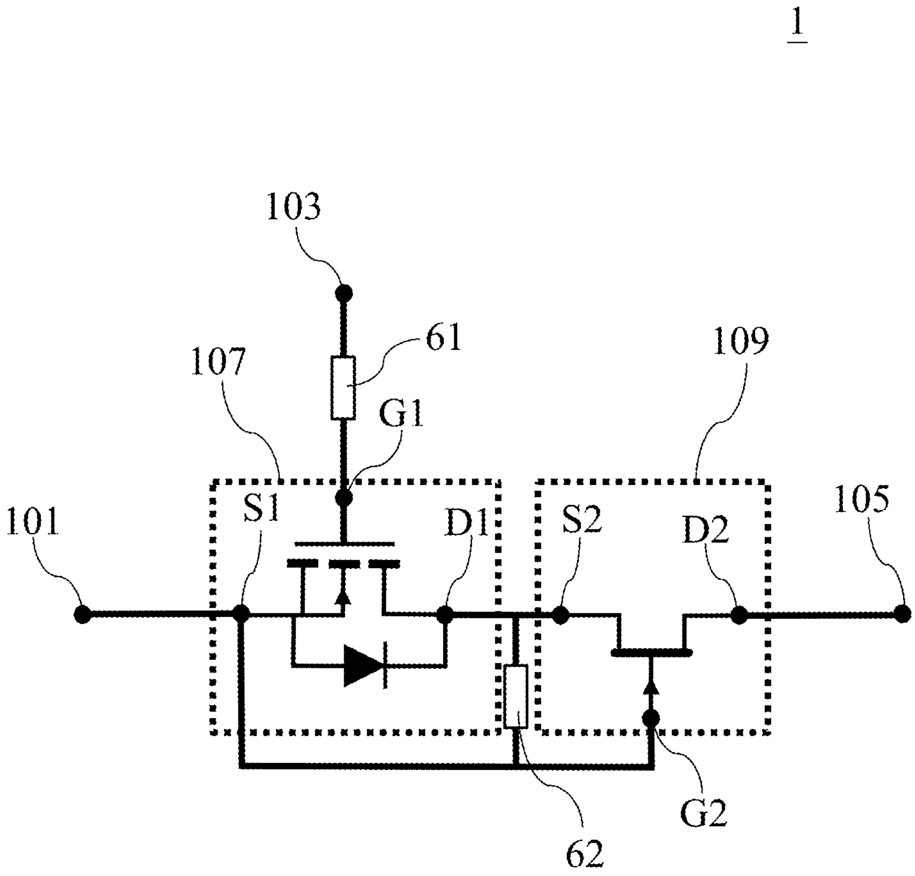
FIG. 6 is a circuit schematic view of an all-lateral WBG cascode switch device according to an embodiment of the present invention.

An embodiment of the present invention is shown in FIG. 6. In this embodiment, the all-lateral WBG cascode switch device 1 further includes a first passive component 61 and a second passive component 62. The first passive component 61 is coupled between the first gate electrode G1 and the gate terminal 103. The second passive component 62 couples a contact between the first drain electrode D1 and the second source electrode S2 to a contact between the second gate electrode G2 and the first source electrode S1. The first passive component 61 and the second passive component 62 may be, for example, a resistor, a Zener diode, or the like. The first passive component 61 and the second passive component 62 may be assembled on the carrier substrate 200 through die bonding or surface mount device (SMD). Accordingly, the all-lateral WBG cascode switch device 1 of the present invention can spread the voltage and/or current by adding passive components for thereby improving the reliability of the components.

In summary, the all-lateral WBG cascode switch device of the present invention improves switching frequency and reliability by using the lateral depletion-mode WBG semiconductor switch and the lateral enhancement-mode silicon semiconductor switch. Therefore, compared with conventional switch devices, the all-lateral WBG cascode switch device of the present invention can provide higher switching frequency and higher reliability, and has more flexibility and versatility in the assembly and packaging architectures to meet the various application requirements.

The above embodiments are used only to illustrate the implementations of the present invention and to explain the technical features of the present invention, and are not intended to limit the scope of the present invention. Any modifications or equivalent arrangements that can be easily accomplished by those skilled in this art are considered to fall within the scope of the present invention, and the scope of the present invention should be limited by the claims of the patent application.

What is claimed is:

1. An all-lateral wide band-gap (WBG) cascode switch device, comprising:

a source terminal;

a gate terminal;

a drain terminal;

a lateral enhancement-mode silicon semiconductor switch, having a first source electrode, a first drain electrode and a first gate electrode; and a lateral depletion-mode WBG semiconductor switch disposed laterally apart from the lateral enhancement-mode silicon semiconductor switch, having a second source electrode, a second drain electrode and a second gate electrode;

wherein:

the first source electrode is coupled to the source terminal;

the first gate electrode is coupled to the gate terminal;

the first drain electrode is coupled to the second source electrode; the second gate electrode is coupled to the first source electrode; and the second drain electrode is coupled to the drain terminal;

wherein, the first source electrode, the first drain electrode, and the first gate electrode of the lateral enhancement-mode silicon semiconductor switch and the second source electrode, the second drain electrode and the second gate electrode of the lateral depletion-mode WBG semiconductor switch have the same vertical orientation to face the same side.

2. The all-lateral WBG cascode switch device of claim 1, wherein the lateral depletion-mode WBG semiconductor switch is one of a depletion-mode gallium nitride (GaN) high electron mobility transistor (HEMT) and a silicon carbide (SiC) junction field-effect transistor (JFET).

3. The all-lateral WBG cascode switch device of claim 1, wherein the lateral enhancement-mode silicon semiconductor switch is an enhancement-mode metal oxide semiconductor field-effect transistor (MOSFET).

4. The all-lateral WBG cascode switch device of claim 1, wherein the first source electrode, the first drain electrode and the first gate electrode of the lateral enhancement-mode silicon semiconductor switch and the second source electrode, the second drain electrode and the second gate electrode of the lateral depletion-mode WBG semiconductor switch are vertically oriented upward.

5. The all-lateral WBG cascode switch device of claim 4, wherein the source terminal, the gate terminal, the drain terminal, the first source electrode, the first drain electrode and the first gate electrode of the lateral enhancement-mode silicon semiconductor switch, and the second source electrode, the second drain electrode and the second gate electrode of the lateral depletion-mode WBG semiconductor switch are coupled by wire bonding.

6. The all-lateral WBG cascode switch device of claim 4, wherein the source terminal, the gate terminal, the drain terminal, the first source electrode, the first drain electrode and the first gate electrode of the lateral enhancement-mode silicon semiconductor switch, and the second source electrode, the second drain electrode and the second gate electrode of the lateral depletion-mode WBG semiconductor switch are coupled by copper clips.

7. The all-lateral WBG cascode switch device of claim 1, wherein the first source electrode, the first drain electrode and the first gate electrode of the lateral enhancement-mode silicon semiconductor switch and the second source electrode, the second drain electrode and the second gate electrode of the lateral depletion-mode WBG semiconductor switch are vertically oriented downward.

8. The all-lateral WBG cascode switch device of claim 7, wherein the source terminal, the gate terminal, the drain terminal, the first source electrode, the first drain electrode and the first gate electrode of the lateral enhancement-mode silicon semiconductor switch, and the second source electrode, the second drain electrode and the second gate electrode of the lateral depletion-mode WBG semiconductor switch are coupled in a flip-chip manner through a plurality of metal interconnections in a carrier substrate.

9. The all-lateral WBG cascode switch device of claim 7, wherein a bottom of a substrate of the lateral enhancement-mode silicon semiconductor switch and a bottom of a substrate of the lateral depletion-mode WBG semiconductor switch have a plurality of trenches.

10. The all-lateral WBG cascode switch device of claim 1, further comprising:

a first passive component coupled between the first gate electrode and the gate terminal; and a second passive component coupled between a first contact and a second contact, the first contact being between the first drain electrode and the second source electrode, the second contact being between the second gate electrode and the first source electrode.

11. The all-lateral WBG cascode switch device of claim 10, wherein the second passive component is one of a resistor and a Zener diode.

12. The all-lateral WBG cascode switch device of claim 1, wherein the all-lateral WBG cascode switch device is packaged into a power switching device by a molding material.

* * * * *